United States Patent [19]

Zapisek

[11] 4,433,253
[45] Feb. 21, 1984

[54] THREE-PHASE REGULATED HIGH-VOLTAGE CHARGE PUMP

[75] Inventor: John M. Zapisek, Hauppauge, N.Y.

[73] Assignee: Standard Microsystems Corporation, Hauppauge, N.Y.

[21] Appl. No.: 329,591

[22] Filed: Dec. 10, 1981

[51] Int. Cl.³ .................. H03L 5/00; H03K 17/687
[52] U.S. Cl. ................................. 307/297; 307/304
[58] Field of Search .................... 307/296 R, 297, 304

[56] References Cited

U.S. PATENT DOCUMENTS

| 4,208,595 | 6/1980 | Gladstein et al. | 307/304 X |
| 4,307,333 | 12/1981 | Hargrove | 307/297 X |
| 4,322,675 | 3/1982 | Lee et al. | 307/297 X |
| 4,388,537 | 6/1983 | Kanuma | 307/297 |

OTHER PUBLICATIONS

Jensen, "Substrate Voltage Generator Circuit", *IBM Tech. Disc. Bull.*, vol. 21, No. 5, Jul. 1978, pp. 727–728.

Primary Examiner—Larry N. Anagnos
Assistant Examiner—David R. Hudspeth
Attorney, Agent, or Firm—Hopgood, Calimafde, Kalil, Blaustein & Judlowe

[57] ABSTRACT

An internal bias generator for providing a negative bias voltage to the substrate of an MOS integrated circuit at a magnitude higher than the power supply voltage includes a pump circuit which comprises a plurality of switches which are sequentially actuated by nonoverlapping clock signals to alternately charge and discharge a capacitor. The clock signals are produced by a generator which includes a series of RC-delay inverting amplifier stages coupled to a series of NOR gates. The bias generator further comprises a threshold-sensitive regulator which uses the source-body effect of substrate bias on the threshold voltage of an MOS FET to control the magnitude of the applied bias voltage. When the sensed threshold voltage deviates from a desired level, certain of the clock signals are disabled, thereby to modify the bias voltage applied to the substrate in a manner to tend to restore the threshold voltage to its desired level.

23 Claims, 6 Drawing Figures

THREE-PHASE REGULATED HIGH-VOLTAGE CHARGE PUMP

The present invention relates generally to bias voltage generating circuits, and more particularly to a circuit for producing a negative bias voltage to the substrate of an MOS integrated circuit and for modifying the bais voltage in accordance with the sensed MOS FET threshold voltage.

As disclosed in U.S. Pat. No. 3,806,741, assigned to the assignee of the present application, the threshold voltage of the FETs comprising an MOS integrated circuit may be set to a desired level by applying a negative bias voltage to the substrate which, through the source-body effect, modifies the FET threshold voltage. Moreover, the aforesaid patent discloses a technique for sensing the threshold voltage and to control the magnitude of the bias voltage in a manner to compensate for deviations in the threshold voltage, and thereby to maintain the threshold voltage at the desired level.

Although the substrate-biasing circuit disclosed in the aforesaid patent has proven to be highly effective in a great number of applications in controlling substrate threshold voltage through the application of an internally developed bias voltage, it has drawbacks in certain applications particularly with regard to the limit of the substrate bias voltage that can be developed from a given supply voltage which, in most MOS circuits, is +5 volts. For example, an increased substrate bias voltage allows a large reduction in the diffusion-to-substrate junction capacitance, thereby increasing the speed of operation of the MOS circuit, and also makes practical the use of higher resistivity substrates, which further allows a reduction in junction capacitance. Achieving a greater control over the substrate bias voltage enables the MOS designer and fabricator to achieve a tight tolerance on the effective threshold of enhancement FETs and allows a more relaxed tolerance on the zero-bias threshold of enhancement FETs.

It is accordingly an object of the invention to provide a substrate bias generator that can be fabricated internal to the substrate and which is capable of providing a negative bias voltage to the substrate that is higher than the supply voltage.

It is a further object of the present invention to provide an internal bias generator which allows for a significant reduction in the diffusion-to-substrate junction capacitance.

It is another object of the invention to provide an internal bias generator of the type described which permits the use of high-resistivity substrates, which further allows for a reduction in junction capacitance.

It is still another object of the invention to provide an internal bias generator of the type described which provides the MOS circuit designer and fabricator with a narrow range of tolerance over the effective threshold voltage of enhancement FETs while allowing larger variations in the zero-bias threshold of enhancement FETs.

It is yet another object of the present invention to provide in a substrate bias voltage generator a source of controlling clock signals in which the widths of the clocks can be independently adjusted and in which there is no overlapping of clocks.

It is still a further object of the invention to provide in a bias generator circuit a means for accurately regulating the threshold voltage by controlling the level of the applied substrate bias voltage in response to the sensed threshold voltage.

To these ends the substrate bias generator of the present invention includes a pump circuit comprising a capacitor which is sequentially charged toward and then above a supply voltage, and then discharged toward a reference voltage, such as ground, through the operation of a series of switches which are, in turn, controlled by sequential clocks to develop a negative bias voltage at a magnitude higher than the supply voltage. The clock signals for the pump circuit are developed by a multi-stage oscillator connected to a series of gates each of which further receives the other clocks as inputs to produce a series of nonoverlapping sequential clocks. The threshold voltage of the substrate is sensed and switch means responsive to the sensed threshold voltage is actuated whenever the threshold voltage deviates from a desired level to disable two of the clock signals, thereby to modify the negative bias voltage applied to the substrate so as to tend to maintain the desired threshold voltage.

To the accomplishment of the above and such further objects as may hereinafter occur, the present invention relates to a substrate bias generator substantially as defined in the appended claims, and as described in the following detailed specification as considered with the accompanying drawings in which:

Figure 1:
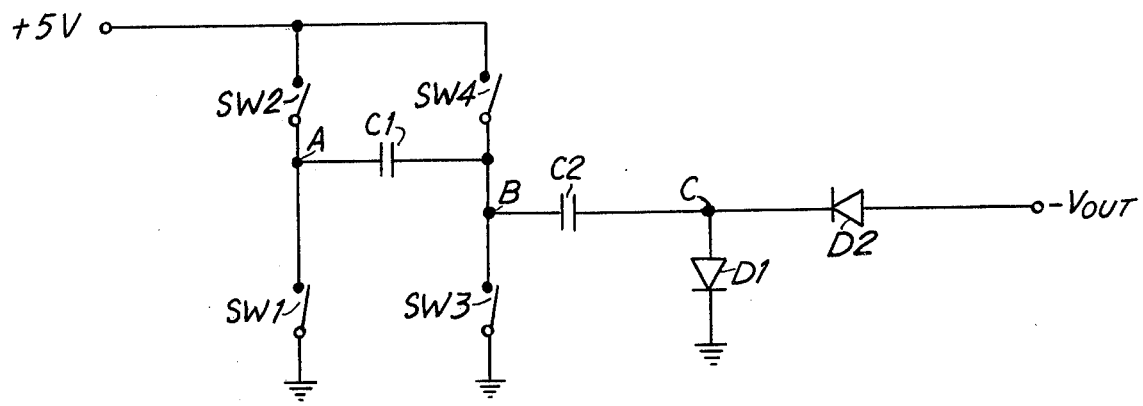
FIG. 1 is an equivalent schematic diagram of the charge pump circuit of the substrate bias generator of the present invention.

FIG. 1 illustrates the equivalent or generalized form of the high-voltage pump circuit of the bias generator of the invention. As therein shown, the bias generator includes a capacitor C1 connected between nodes A and B. Node A is also connected to one contact of switch SW1 and of switch SW2 and node B is connected to one contact of switch SW3 and of switch SW4. The other contacts of switches SW1 and SW3 are connected to a reference voltage, here shown as ground, and the other contacts of switches SW2 and SW4 are connected to a supply voltage, shown in FIG. 1 as being +5 volts. As described in greater detail below, switches SW1, SW2, SW3, and SW4 are actuated in a controlled time sequence by the sequential application of control or clock signals to the control terminals of the switches.

Node B is also connected to one side of a second capacitor C2, the other side of which is connected to node C, which, in turn, is connected to the anode of a diode D1 and the cathode of a diode D2. The cathode of diode D1 is connected to ground and the anode of diode D2 is the output of the pump circuit at which the negative bias voltage $-V_{out}$ appears.

In the operation of the circuit of FIG. 1, during a first phase, switches SW1 and SW4 are made conductive, or closed, applying ground to node A and +5 volts to node B, and charging capacitors C1 and C2 toward Vdd or to +5 volts. Switches SW1 and SW4 are then opened, allowing nodes A and B to float. During the second phase, switch SW2 is closed, raising node A to +5 volts. Since capacitor C1 remains charged, node B is brought at this time to nearly +10 volts and this voltage is applied across capacitor C2. Switch SW2 is then opened, allowing node A to float. During the third phase switch SW3 is closed, pulling node B toward ground. This negative swing at node B of nearly ten volts is available to the pump circuit consisting of capacitor C2 and diodes D1 and D2, and is applied by the pump circuit to the substrate. Switch SW3 is then opened in preparation for the next cycle of operation.

In actual operation, node B will be charged during the second phase to nearly 10 volts only after −Vout is low. Otherwise, charge splitting between capacitors C1 and C2 will occur, and the voltage on node B will be raised above +5 volts by only a part of the original amount. If a significant DC load on −Vout is anticipated, the charge-splitting effect can be reduced by making capacitor C1 larger than capacitor C2.

Figure 2:
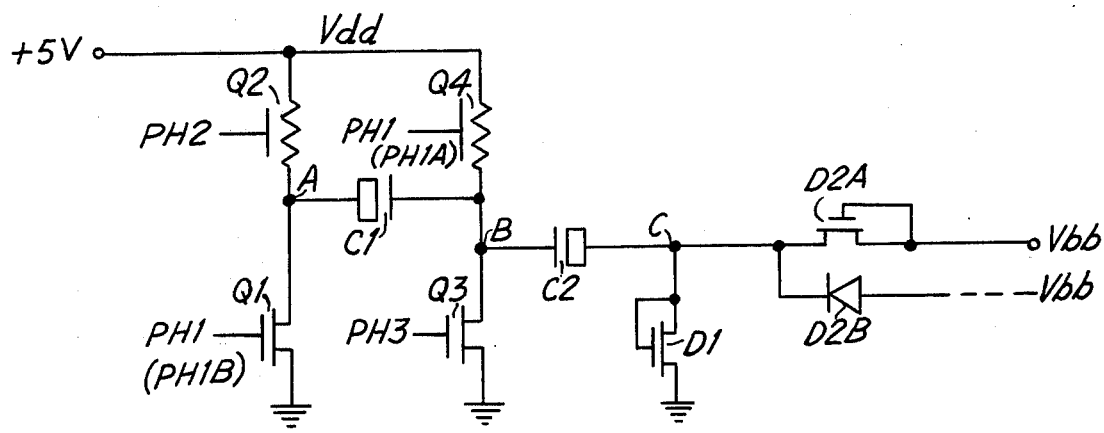
FIG. 2 is an NMOS implementation of the circuit of FIG. 1.

FIG. 2 illustrates an implementation of the pump circuit of FIG. 1 with NMOS devices, in which switches SW1 and SW3 are implemented by enhancement-mode FETs Q1 and Q3, and switches SW2 and SW4 are implemented by depletion-mode FET devices Q2 and Q4. Diodes D1 and D2A are also implemented by enhancement-mode MOS devices, and capacitors C1 and C2 are implemented by depletion-mode MOS devices. The gate terminals of the FETs used to implement capacitors C1 and C2 are connected to node B, and the drains and sources of those FETs are respectively connected to nodes A and C. The effective threshold of FET Q4 (with Vsource at approximately Vdd) should not be more negative than Vdd is positive, so that FET Q4 can be turned off during phase two by connecting its gate to ground. Since the source of FET Q4 (node B) is at approximately Vdd, grounding its gate results in a Vgs for the device of approximately −Vdd. Diode D2B represents the drain/source-to-substrate junction of devices C2, D1, and D2A. The pump of FIG. 2 may also be fabricated without diode D2A, relying solely on diode D2B to achieve conduction of the bias voltage Vbb to the substrate.

In the operation of the circuit of FIG. 2, FETs Q1 and Q4 are both rendered conductive during the first phase by clock PH1, or, in an alternate sequence, as described below, during delayed clocks PH1B and PH1A, which are respectively applied to the gates of FETs Q1 and Q4. FET Q2 is rendered conductive during the occurrence of clock PH2, which defines the second phase of the operating cycle, applied to the gate of FET Q2, and FET Q3 is rendered conductive during the third phase during the occurrence of clock PH3 applied to its gate. This sequential switching on and off of FETs Q1, Q2, Q3, and Q4, under the control of the clocks, causes capacitors C1 and C2 to be charged in the manner described previously, with respect to FIG. 1, to produce a negative substrate bias voltage Vbb which has a greater absolute magnitude than the supply voltage Vdd.

Figure 3:
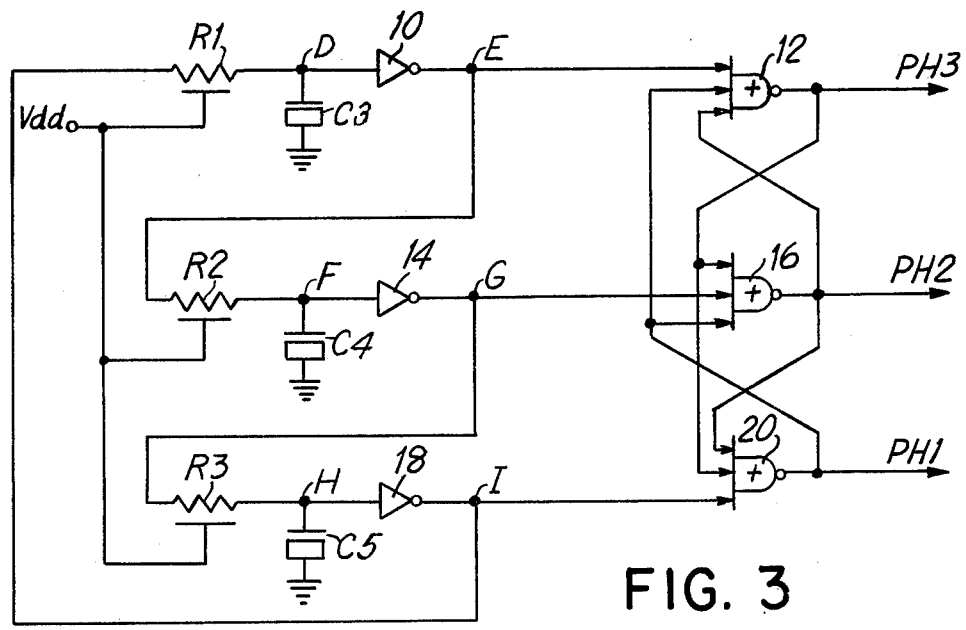
FIG. 3 is a schematic diagram of the clock generator of the bias generator of the invention.

The clocks PH1, PH2, and PH3, which sequentially control the operation of the switch FETs Q1–Q4 of the pump circuit of FIG. 2, are developed by the three-phase clock generator circuit of FIG. 3, which consists in part of three RC-delay inverting amplifier stages comprising an oscillator. The outputs of each amplifier stage are respectively coupled as inputs to a corresponding number of NOR gates, the outputs of which are the three clocks PH1, PH2 and PH3.

As shown in FIG. 3, each stage of the oscillator includes a depletion-mode FET resistor connected to one plate of a depletion-mode MOS capacitor at an intermediate node to form an RC circuit. The other plate of the capacitor is grounded. The intermediate node is connected to an input of an inverter, the output of which is connected to an output node. The latter is connected to an input of the output NOR gate associated with that amplifier stage of the oscillator and to the FET resistor of the next amplifier stage. Thus, the first stage of the oscillator comprises an FET resistor R1, one end of which is connected to an intermediate node D to which one plate of a capacitor C3 is connected. The other plate of capacitor C3 is grounded. Node D is also connected to the input of an inverter 10, the output of which is at an output node E connected to one input of a NOR gate 12, the output of which is the third clock PH3. Node E is also connected to an FET resistor R2 in the second amplifier stage, which further includes an intermediate node F, a capacitor C2, an inverter 14, and an output node G.

The signal at node G is connected as one input of a NOR gate 16, the output of which is the second clock PH2. Node G is also connected to one terminal of an FET resistor R3, the other end of which is connected to an intermediate node H and to a capacitor C5 in the third amplifier stage of the oscillator. Node H is connected to an inverter 18, the output of which at an output node I is connected as one input of a third NOR gate 20, the output of which is the first clock PH1. Node I is also connected to a terminal of FET resistor R1 in the first amplifier stage. The gates of the FET resistors R1, R2, and R3 are all connected to a supply voltage Vdd.

The NOR gates 12, 16, and 20, which provide at their respective outputs the three clock phases PH3, PH2 and PH1, also each receive as inputs the other two clocks. Thus, NOR gate 12 receives clocks PH1 and PH2 as inputs, NOR gate 16 receives clocks PH3 and PH1 as inputs, and NOR gate 20 receives clocks PH2 and PH3 as inputs.

The frequency of operation of the three-phase oscillator of FIG. 3 is determined by the requirement that the sum of the phase shifts of the three stages be 360 degrees. Inverters 10, 14, and 18 are preferably sufficiently fast so that the phase shift through each stage is almost totally due to the RC delay. In this case, the period of oscillation can be approximated as $R1 \times CD + R2 \times CF + R3 \times CH$, where R1, R2 and R3 are the effective resistances of FETs R1, R2, and R3, and CD, CF, and CH are the effective capacitances of nodes D, F, and H. Capacitances CD through CH include the gate capacitances of FETs C3 through C5 as well as part of the distributed channel capacitances of FET resistors R1, R2, and R3.

Since each of the output clocks PH1, PH2, and PH3 is produced by a NOR gate 20, 16, or 12, which has the other two phases as inputs, a nonoverlapping relationship among the clocks is assured because the start of a new clock must wait for the termination of the current clock. For example, when clock PH1 is high and clocks PH2 and PH3 are low, a logic high on node I will drive clock PH1 low which allows clock PH2 to rise. The logic high on node I will then propagate through node D. The resulting logic low on node E will then propagate through the RC combination of R2 and CF to node F. The resulting logic high at node G terminates clock PH2 and begins clock PH3. Thus, the duration of clock PH2 is approximately the sum of propagation delays R1×CD+R2×CF and is generally independent of R3×CH. Similarly, the duration of clock PH3 is independent of R2×CF, and the duration of clock PH1 is independent of R1×CD. Although each RC delay affects the duration of two clock phases, the manipulation of the other two RC delays can be used to affect the duration of one clock phase while keeping the durations of the other two clock phases constant.

Figure 4:
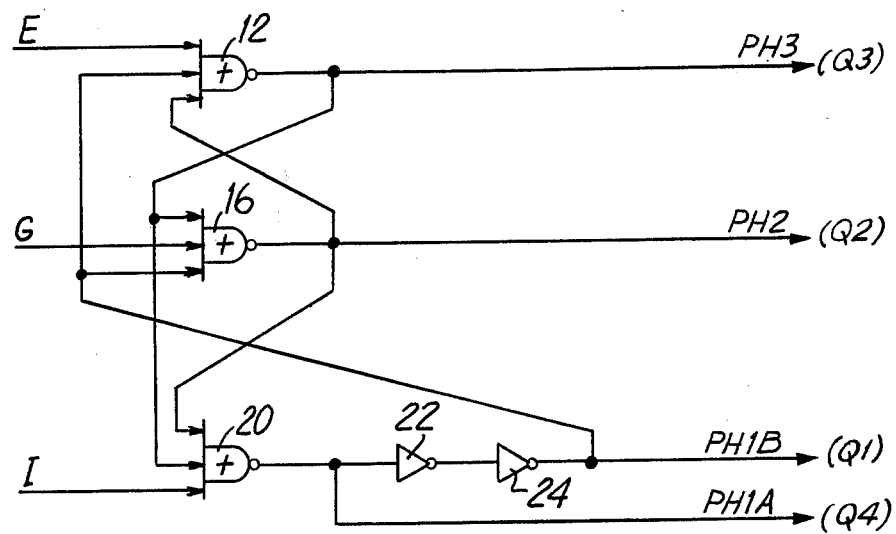
FIG. 4 illustrates a possible variation in the clock generator circuit of FIG. 3.

In the modification of the circuit of FIG. 3 shown in FIG. 4, the output of NOR gate 20 is applied directly to the gate of FET Q4 in FIG. 2 as clock PH1A, and is also propagated through a pair of series-connected inverters 22 and 24, the output of which is the clock PH1B, which is slightly delayed with respect to clock PH1A. Clock PH1B is applied to the inputs of NOR gates 12 and 16 and to the gate of FET Q1 in the circuit of FIG. 2.

The delay between clocks PH1B and PH1A, as achieved by the modification of the clock generator shown in FIG. 4, introduces a slight delay between the turn-off of FET Q4 (FIG. 2) and the turn-off of FET Q1. This ensures that node B in the circuit of FIG. 2 is truly floating before node A begins to rise. Otherwise, FET Q4 would provide a leakage path from node B to Vdd while charge was being coupled into node B through capacitor C1. The voltage boost at node B during the second phase (clock PH2) would then be reduced.

Figure 5:
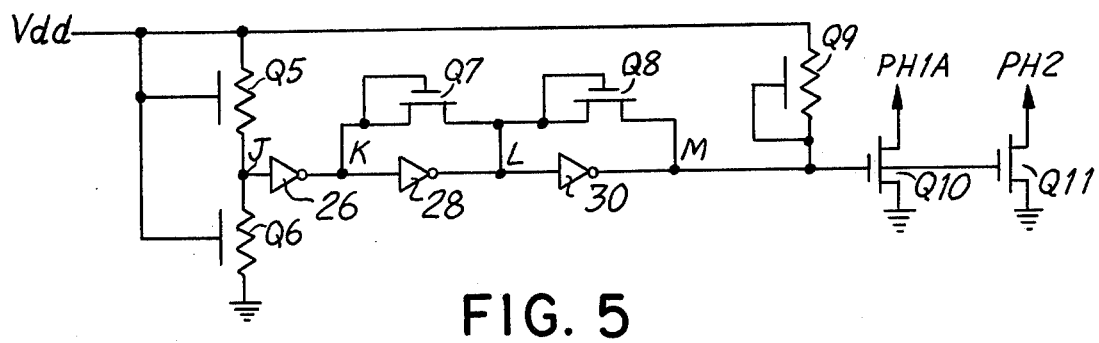
FIG. 5 is a schematic diagram of the threshold-sensitive regulator of the bias generator of the invention.

The bias generator of the invention also includes a circuit of the type shown in FIG. 5 for sensing the threshold voltage established at the input FET of inverter 26 by the application of the negative substrate bias and for appropriately modifying the operation of the pump circuit of FIG. 2 to adjust the substrate bias voltage and thereby maintain the threshold voltage at a desired value. The threshold-regulator circuit, as in the embodiment shown in FIG. 5, includes a voltage divider made up of depletion-mode FETs Q5 and Q6, the gates of which receive the supply voltage Vdd. A reference node J is established between these FETs. The reference voltage at node J is applied to an inverter 26, the output of which at node K is applied to inverter-amplifiers 28 and 30. A node L is at the output of inverter 30. Enhancement-mode FETs Q7 and Q8 are respectively connected across nodes K and L and across nodes L and M, and act as clamp diodes. A depletion-mode FET Q9 is connected to node M and to the Vdd supply voltage. Node M is also connected to the gates of clamp FETs Q10 and Q11, which respectively receive clocks PH1A and PH2 at their drains. The sources of FETs Q10 and Q11 are connected to ground.

Figure 6:
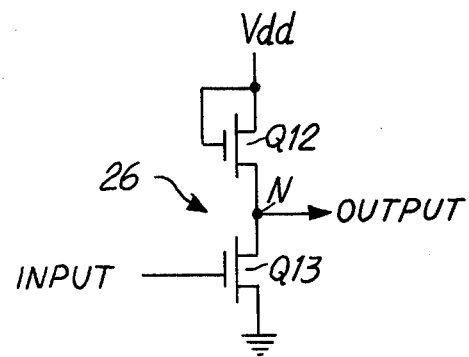
FIG. 6 is a schematic diagram of a constant-gain inverter for use in the regulator of FIG. 5.

FIG. 6 illustrates a preferred configuration of the inverter 26 in the circuit of FIG. 5. The inverter includes a first enhancement-mode FET Q12 with a drain and gate connected to Vdd and a source connected to the output node N and to the drain of a second enhancement-mode FET Q13. The gate of the latter receives the input to the inverter and its source is connected to ground.

In operation, the voltage divider of the regulator circuit shown in FIG. 5 made up of FETs Q5 and Q6 provides a nearly constant reference voltage at node J. When the magnitude of the substrate bias voltage Vbb is low the logic threshold of inverter 26 will be below the voltage on node J, which is at essentially a fixed fraction of Vdd, making node K low. Inverters 28 and 30 amplify this signal and apply a low voltage to clamp devices FETs Q10 and Q11. When the clamp devices are turned off, the charge pump is turned fully on, increasing Vbb. As Vbb is increased, the logic threshold of inverter 26 rises as the effective enhancement device threshold rises. When the logic threshold of inverter 26 exceeds the voltage on node J, node K will rise. The amplified signal applied to the gates of FETs Q10 and Q11 at node M will turn these devices on and clamp or disable the clock signals PH1A and PH2 to ground, thereby deactivating the pump circuit so as to prevent a further increase in Vbb.

The logic threshold of inverter 26, as shown in detail in FIG. 6, predictably and reliably tracts the effective enhancement device threshold. By making the gain of the inverter very high, the logic threshold of the inverter can be brought to within several tenths of a volt above device threshold. By making the gain nearly constant, the spread between logic and device thresholds is made more predictable. If FETs Q12 and Q13 of inverter 26 are both enhancement-mode devices, the gain of the inverter can be made a function of the geometries of these devices and independent of depletion device threshold. By using larger than normal geometries for FETs Q12 and Q13, the gain of the inverter 26 can be made more independent of variations in processing-related "delta-L" and "delta-W" effects.

The constant-gain characteristic of inverter 26 makes it also well suited for use as inverters 28 and 30 in the regulator circuit of FIG. 5 although with geometries giving a reduced gain. Whereas inverter 26 should have high gain, inverters 28 and 30 should have no more gain than is needed to reliably operate the clamp FETs Q10 and Q11 to reduce the likelihood of oscillation in the Vbb control feedback path. For the same reason, enhancement FETs Q7 and Q8 are added across inverters 28 and 30 as clamp diodes. The effect of FET Q7 is to limit the positive voltage on node K to one diode-drop above node L. Similarly FET Q8 limits the positive voltage on node L. Limiting the positive voltage on nodes K and L reduces the time needed to discharge these nodes when the regulator attempts to change its output. Decreasing the response time of the regulator helps further stabilize the control feedback path.

Depletion pull-up FET Q9 allows node M to rise as high as the Vdd supply voltage when necessary. (The enchancement pull-up of inverter 30 will rise only to within one effective enhancement threshold of Vdd). This increases the regulator's ability to reduce the clock signals PH1A and PH2 with enhancement devices Q10 and Q11 whenever the threshold voltage exceeds a desired level, thereby to reduce the level of the substrate bias voltage Vbb produced by the pump circuit of FIG. 2 in response to the reduction of these clock signals. Reduction of the amplitude of clock signals PH1A and PH2 causes a reduction in the amplitude of the voltage swing at node B, thereby effecting a reduction of substrate bias voltage Vbb. Alternatively, the drains of the devices Q10 and Q11 may be connected to node A and to node B, respectively, in order to more directly reduce the amplitude of the voltage swing at node B. This alternative, however, causes an unnecessarily large amount of current to be drawn from the supply voltage.

It will be appreciated that a substrate bias generator is provided by the present invention which produces accurate control over the threshold voltage of a substrate through the internal generation of a negative bias voltage that is higher in its absolute value than the supply voltage. The bias generator is controlled by a series of nonoverlapping clock signals which can be independently adjusted as to their duration. The controlling clock signals are selectively disabled and removed from the pump circuit upon the sensing of an excessive threshold voltage, thereby tending to maintain the enhancement device threshold at a desired value.

It will also be understood and appreciated that although the invention has been described with reference to several specific embodiments, variations may be made to the embodiments described without necessarily departing from the spirit and scope of the invention.

What is claimed is:

1. A circuit for applying a bias voltage to a semiconductor substrate, said circuit comprising a first and a second node, charge-coupling means operatively connected between said first and second nodes, a source of a supply voltage, a reference voltage having an absolute value less than said supply voltage, first and second switch means having first terminals operatively connected to said first node and second terminals repectively operatively connected to said reference voltage and to said supply voltage, third and fourth switch means having first terminals operatively connected to said second node and second terminals respectively operatively connected to said reference voltage and to said supply voltage, means for sequentially actuating and deactuating said first, second, third, and fourth switch means in a predetermined time sequence, thereby to alternately charge and discharge said second node between a voltage having a value greater in absolute value than said supply voltage and a voltage nearly equal to the reference voltage, said sequential actuating and deactuating means including means for deactuating said second switch means following the deactuation of said first and fourth switch means and for actuating said third switch means following the deactuation of said second switch means, and a pump circuit operatively connected to said second node and effective to apply a bias voltage corresponding to the voltage swing developed at said second node to the substrate.

2. The circuit of claim 1, wherein said reference voltage is ground.

3. The circuit of claim 1, in which said sequential actuating means comprises means for applying clock signals to the control terminals of said first, second, third and fourth switch means in a predetermined time sequence.

4. The circuit of claim 1, in which said first and fourth switch means are actuated at substantially the same time, while said second and third switch means are unactuated.

5. The circuit of claim 1, in which said pump circuit includes second charge-coupling means connected to said second node and diode means operatively connected to said second charge-coupling means.

6. The circuit of claim 1, in which said first and third switch means are each enhancement-type field-effect tranistors, and said second and fourth switch means are depletion-type field-effect transistors.

7. The circuit of claim 3, further including means for generating said clock signals, said generating means comprising a plurality of amplifier stages comprising an oscillator and a corresponding plurality of logic gates coupled respectively to said plurality of amplifier stages, the outputs of said gates constituting said clock signals.

8. The circuit of claim 7, in which each of said amplifier stages comprises an RC delay circuit and an inverter coupled to said RC delay circuit, the output of the inverter in each one of said amplifier stages being connected to the RC delay circuit of another of said amplifier stages.

9. The circuit of claim 7, in which each of said logic gates includes a NOR gate having a plurality of inputs, each of said NOR gates receiving as inputs the outputs of the others of said logic gates.

10. The circuit of claim 3, further comprising means for sensing the threshold voltage of the substrate, and means operatively connected to and responsive to said sensing means for disabling at least one of said clock signals at at least one of said first or second nodes when the sensed threshold voltage varies from a predetermined level.

11. The circuit of claim 10, in which said sensing means includes a voltage divider comprising a reference node at which a substantially constant reference voltage is established, a high-gain inverter having an input connected to said reference node, and disabling means operatively connected to the output of said inverter and actuated when the voltage at said inverter output varies by a predetermined amount in accordance with the enhancement device threshold voltage, said disabling means being effective when thus actuated to cause a reduction in the level of voltage swing at said second node.

12. A bias generator circuit for applying a bias voltage to a substrate of a semiconductor integrated circuit to establish a threshold voltage, said bias generator circuit comprising a supply voltage, capacitive means, an output node connected to said capacitive means, a plurality of switching means operatively connected to said supply voltage, to said capacitive means, and to a reference voltage, said switching means being effective when actuated sequentially alternately to charge said capacitive means and said node to a voltage up to and exceeding said supply voltage and to discharge said capacitive means toward said reference voltage, a pump circuit operatively connected to said output node and effective to apply a bias voltage corresponding to the voltage developed at said output node to the substrate, means for providing a plurality of actuating signals to said plurality of switching means to control the charging and discharging of said capacitive means, means for sensing the threshold voltage of enhancement FETs incorporated within said semiconductor integrated circuit, and means operatively connected to said sensing means for disabling, when the sensed threshold voltage varies from a predetermined value, a selected one or more of said plurality of said actuating signals, thereby to modify the bias voltage applied to the substrate.

13. The circuit of claim 12, wherein said reference voltage is ground.

14. The circuit of claim 13, in which said pump circuit includes second capacitive means connected to said node and diode means operatively connected to said second capacitive means.

15. The circuit of claim 12, in which said actuating signals include sequential clock signals, and further including means for producing said clock signal comprising a plurality of amplifier stages constituting an oscillator and a corresponding plurality of gating means respectively coupled to said plurality of amplifier stages, the outputs of said gating means constituting said clock signals.

16. The circuit of claim 15, in which each of said gating means includes a NOR gate having a plurality of inputs, each of said NOR gates receiving at its inputs the outputs of the others of said gating means.

17. The circuit of claim 12, in which said threshold voltage sensing means comprises a voltage divider establishing a substantially constant reference voltage at a reference node, and a high-gain inverter connected to said reference node and producing an output voltage which is related to the deviation of enhancement FET threshold voltage from a predetermined value.

18. The circuit of claim 17, in which said disabling means comprises switching means receiving at least one of said clock signals at one of its terminals and having its control terminal operatively connected to the output of said inverter.

19. A circuit for applying a bias voltage to a semiconductor substrate, said circuit comprising a first and a second node, charge-coupling means operatively connected between said first and second nodes, a source of a supply voltage, a reference voltage having an absolute value less than said supply voltage, first and second switch means having first terminals operatively connected to said first node and second terminals repectively operatively connected to said reference voltage and to said supply voltage, third and fourth switch means having first terminals operatively connected to said second node and second terminals respectively operatively connected to said reference voltage and to said supply voltage, means including means for applying clock signals to the control terminals of said first, second, third and fourth switch means for sequentially actuating and deactuating said first, second, third, and fourth switch means in a predetermined time sequence, thereby to alternately charge and discharge said second node between a voltage having a value greater in absolute value than said supply voltage and a voltage nearly equal to the reference voltage, and means for generating said clock signals including a plurality of amplifier stages comprising an oscillator and a corresponding plurality of logic gates coupled respectively to said plurality of amplifier stages, the outputs of said gates constituting said clock signals.

20. The circuit of claim 19, in which each of said amplifier stages comprises an RC delay circuit and an inverter coupled to said RC delay circuit, the output of the inverter in each one of said amplifier stages being connected to the RC delay circuit of another of said amplifier stages.

21. The circuit of claim 19, in which each of said logic gates includes a NOR gate having a plurality of inputs, each of said NOR gates receiving as inputs the outputs of the others of said logic gates.

22. The circuit of claim 19, further comprising means for sensing the threshold voltage of the substrate, and means operatively connected to and responsive to said threshold-voltage sensing means for disabling at least one of said clock signals at at least one of said first or second nodes when the sensed threshold voltage varies from a preetermined level.

23. The circuit of claim 22, in which said threshold-voltage sensing means includes a voltage divider comprising a reference node at which a substantially constant reference voltage is established, a high-gain inverter having an input connected to the output of said inverter and actuated when the voltage at said inverter output varies by a predetermined amount in accordance with the enhancement device threshold voltage, said disabling means being effective when thus actuated to cause a reduction in the level of voltage swing at said second node.

* * * * *